United States Patent [19]

Fujii et al.

[11] Patent Number: 5,569,934
[45] Date of Patent: Oct. 29, 1996

[54] OPTICAL DEVICE WITH AN ASYMMETRIC DUAL QUANTUM WELL STRUCTURE

[75] Inventors: Kazuhito Fujii, Atsugi; Takeo Ono, Sagamihara, both of Japan

[73] Assignee: Canon Kabushiki Kaisha, Tokyo, Japan

[21] Appl. No.: 535,349

[22] Filed: Sep. 28, 1995

Related U.S. Application Data

[63] Continuation of Ser. No. 139,866, Oct. 22, 1993, abandoned, which is a continuation of Ser. No. 781,580, Oct. 23, 1991, abandoned.

[30] Foreign Application Priority Data

Oct. 27, 1990 [JP] Japan ..................... 2-289644

[51] Int. Cl.$^6$ ............... H01L 29/205; H01L 31/0304
[52] U.S. Cl. ............... 257/21; 359/248; 257/184; 257/25
[58] Field of Search .................. 357/30, 4, 16, 357/19; 359/248; 257/21, 25, 184

[56] References Cited

U.S. PATENT DOCUMENTS

| | | | |
|---|---|---|---|
| 4,122,407 | 10/1978 | Van Vechten | 257/184 |
| 4,727,341 | 2/1988 | Nishi et al. | 359/248 |
| 4,884,119 | 11/1989 | Miller | 357/19 |
| 5,019,519 | 5/1991 | Tanaka et al. | 357/19 |
| 5,032,885 | 7/1991 | Shiga | 357/30 |
| 5,103,455 | 4/1992 | Eichen | 372/45 |

FOREIGN PATENT DOCUMENTS

| | | | |
|---|---|---|---|
| 1204019 | 8/1989 | Japan | 359/248 |
| 2210332 | 8/1990 | Japan | 359/248 |
| 3179428 | 5/1991 | Japan . | |
| 2227571 | 8/1990 | United Kingdom . | |

OTHER PUBLICATIONS

J. Lee, et al., "Excitonic spectra of asymmetric, coupled double quantum wells in electric fields," Physical Review B, vol. 39, No. 14, May 1989, pp. 10133–10143.

K. W. Steijn, et al., "Electroabsorption and electrorefraction in GaAs/AlGaAs waveguides containing asymmetric coupled quantum wells," Applied Physics Letters, vol. 55, No. 4, Jul. 4, 1989, pp. 383–385.

Primary Examiner—Jerome Jackson, Jr.
Attorney, Agent, or Firm—Fitzpatrick, Cella, Harper & Scinto

[57] ABSTRACT

An optical device includes an asymmetric dual quantum well (ADQW) structure which is comprised of a plurality (at least two) of different semiconductor quantum well layers coupled to each other. In the ADQW structure, the width of a deeper quantum well layer having a narrower band gap is made narrower than that of a less deeper quantum well layer having a wider band gap such that the shift of an exciton wavelength is scarcely caused due to the quantum confined Stark effect by the application of an electric field in a predetermined range. As a result, only a refractive index of the ADQW structure is changed, but an absorption factor is scarcely changed for a given range of wavelength by the application of the electric field. Further, there is provided a member for applying an electric field to the asymmetric dual quantum well structure.

27 Claims, 10 Drawing Sheets

OPTICAL DEVICE WITH AN ASYMMETRIC DUAL QUANTUM WELL STRUCTURE

This application is a continuation of application Ser. No. 08/139,866 filed Oct. 22, 1993, abandoned which in turn is a continuation of application Ser. No. 07/781,580 filed Oct. 23, 1991, now abandoned.

BACKGROUND OF THE INVENTION

1. Field of the Invention

This invention relates to optical devices in which a semiconductor quantum well structure is formed as an asymmetric dual quantum well (ADQW) structure including a plurality of different quantum wells (typically two wells) for achieving a specific property. According the specific property, only a refractive index in the ADQW is changed, but not an absorption factor therein, by applying a reverse bias electric field thereto.

2. Related Background Art

In recent years there has been much interest in exploiting and developing optical communication systems which are capable of transmitting a great capacity of information at a high speed. Among them, wavelength or frequency division multiplexing systems and coherent optical communication systems are highlighted for their capability of communicating a greater capacity of information at a high speed which can be obtained by making a use of characterictics of light. Therefore, the intense effort has been made in developing devices for processing lights of different wavelengths or for modulating the phase of Light and the like.

In the wavelength division multiplexing systems, if semiconductor lasers are used as a light source, a wavelength range of tunable or changeable radiation lights is at most several tens Å, so that when the wavelength division multiplexing communication is conducted within such wavelength range, devices for selecting or filtering light having a wavelength spectrum width less than 1 Å at a resolution of 2~3 Å are required.

FIG. 1 shows the structure of a waveguide type filter including a distributed reflector portion which is an example of the above-mentioned devices (see Numai et al.: Tunable filter using a phase shift type DFBLD, Informal Paper No. C-161 distributed at Autumnal Grand Meeting of Electronics Information Commun. Academy (1988)).

In the device of FIG. 1 of the distributed feedback laser diode (DFBLD) type, there are provided, on a substrate 201, a waveguide 202 with a grating 203 and a partial active layer 204. The device is divided into active portions 205a and 205b including the active layer 204 and a phase regulating portion 206 without the active layer 204 formed therebetween. Anti-reflection coats 207a and 207b made of $SiN_x$ are deposited on both end surfaces of the device. Reference letters $N_a$, $N_p$ and θ respectively denote refractive indices of the waveguide 202 in the active portions 205a and 205b and the phase regulating portion 206 and the length of the phase regulating portion 206. The refractive indices $N_a$ and $N_p$ in the waveguide 202 are changed by injecting an active current $I_a$ and a phase regulating current $I_p$ into the respective portions 205a, 205b and 206 to vary carrier densities in the waveguide 202 thereat. Thus, the wavelength of light reflected by the grating 203 or distributed reflector structure is varied to achieve a tunable filter.

Such a tunable filter, however, has drawbacks that a decrease of the refractive index resulting from the carrier injection into the waveguide is reduced by an increase of the refractive index resulting from a rise in temperature due to current flowing in the waveguide 202 and that thermal noise also occurs due to such rise of temperature. Moreover, there are several disadvantages that spontaneous emission appears due to the carrier injection, that a beat noise occurs from interaction between the spontaneous emission and an incident light, and others.

FIG. 2 shows another prior art example which is a filter of Fabry-Perot type using a structure similar to surface emission type lasers (see Kubota et al.: Tunable filter of surface emission laser type, Informal Paper No. C-246 distributed at Vernal Grand Meeting of Electronics Information Commun. Academy (1990)).

In the device of FIG. 2, there are provided, on a substrate 211, an etch-stop layer 212 and layers 213, 214, 215 and 216 of n-InP, p-GaInAsP, p-InP and p-GaInAsP, Anti-reflection coats 217 and 218 of $TiO_2/SiO_2$ multi-layered film are respectively formed on the layer 216 of p-GaInAsP and the etch-stop layer 212 in a window etched in the substrate 211. In this device, a selected or filtered wavelength of output light is changed by varying the refractive index by the injection of carriers, similar to the device shown in FIG. 1.

Such filter, however, also has drawbacks similar to those of the device of FIG. 1 because carriers are injected into the device to shift the selected wavelength. That is, characteristics are degraded under adverse influences of the rise in temperature and spontaneous emission, similar to the device of FIG. 1. As a result, a tunable width of wavelength becomes narrow.

FIG. 3 shows a prior art example which is a phase modulating device in which an electric field is applied to a superlattice layer 223 (intrinsic multiple quantum well (i-MQW) layer) to change the refractive index thereof by quantum confined Stark effect (QCSE) (see H. Nagai et al.: Field-induced modulations of refractive index and absorption coefficient in a GaAs/AlGaAs quantum well structure, Elect. Lett. 14th vol. 22, No. 17 (1986)).

In the device of FIG. 3, there are formed, on an n-GaAs substrate 221 (dopant concentration: $4 \times 10^{18}$ cm$^{-3}$), an n-$Al_{0.4}Ga_{0.6}As$ layer 222 (thickness: 35 μm and dopant concentration: $1 \times 10^{16}$ cm$^{-3}$), the i-MWQ layer 223 and an electrode 224 of Au thin film (thickness: 200 Å). In the substrate 221, a window is etched and another electrode 225 of Au thin film (thickness: 200 Å) is formed. The i-MQW layer 223 is comprised of ten periodes of GaAs layer (thickness: 100 Å) and $Al_{0.4}Ga_{0.6}As$ layer (thickness: 150 Å).

Such phase modulating device, however, also has the following drawbacks. Since an exciton wavelength of the i-MQW layer 223 is shifted to a longer one or greater value due to the QCSE by the applied electric field, absorption factor thereof as well as refractive index is changed and hence the intensity of an output varies if the wavelength of an input light is changed. Thus, a usable width of wavelength of the input light becomes narrow. Further, the absorption factor abruptly increases near the wavelength of light, to be phase-modulated, so that the intensity of output light decreases greatly.

SUMMARY OF THE INVENTION

An object of the present invention is to provide an optical device with an ADQW which is capable of changing the refractive index of the ADQW by the application of an electric field thereto without changing the absorption factor thereof in a given range of wavelength.

According to one aspect of the optical device with ADQW of the present invention, there is provided an ADQW which is comprised of a plurality (at least two) of different semiconductor quantum well layers coupled to each other. In the ADQW, the width of a deeper quantum well layer having a narrower band gap is made narrower than that of a less deeper quantum well layer having a wider band gap such that the shift of an exciton wavelength is scarcely caused due to the QCSE by the application of an electric field in a predetermined range. As a result, only a refractive index of the ADQW is changed for a given range of wavelength by the application of the electric field.

According to another aspect of the optical device of the present invention, there is provided an asymmetric dual quantum well structure including at least two different quantum well layers. The asymmetric dual quantum well structure is structured such that the shift of an exciton wavelength due to the quantum confined Stark effect scarcely occurs by the application of an electric field in a predetermined range. Further, there is provided a member for applying an electric field to the asymmetric dual quantum well structure.

These advantages and others will be more readily understood in connection with the following detailed description, claims and drawings.

DESCRIPTION OF THE PREFERRED EMBODIMENT

Figure 1:
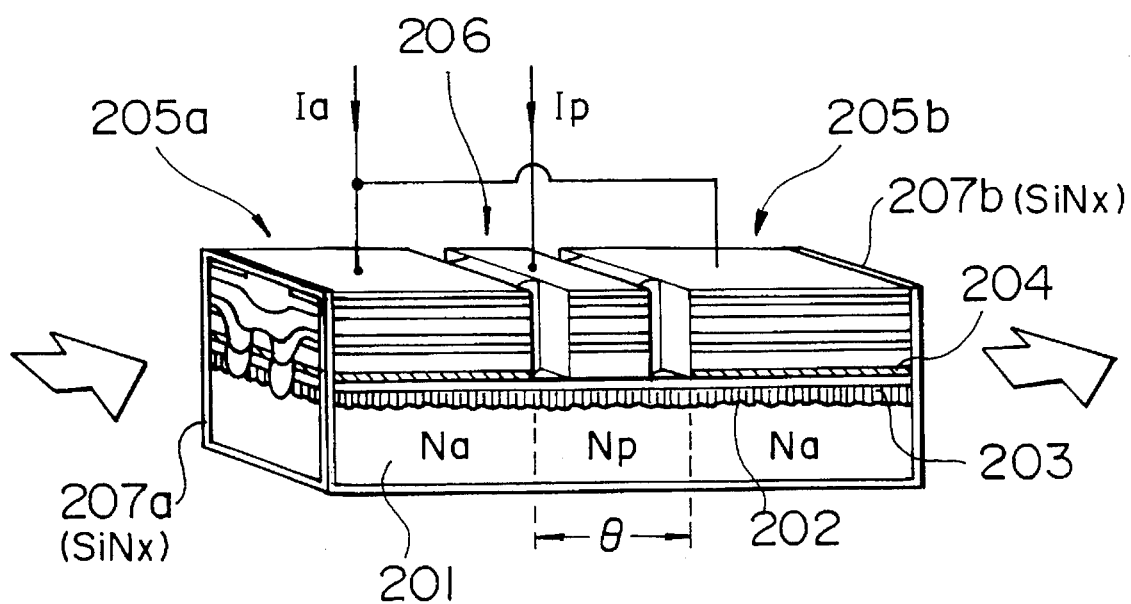
FIG. 1 is a view showing the structure of a prior art waveguide type tunable filter.
Figure 2:
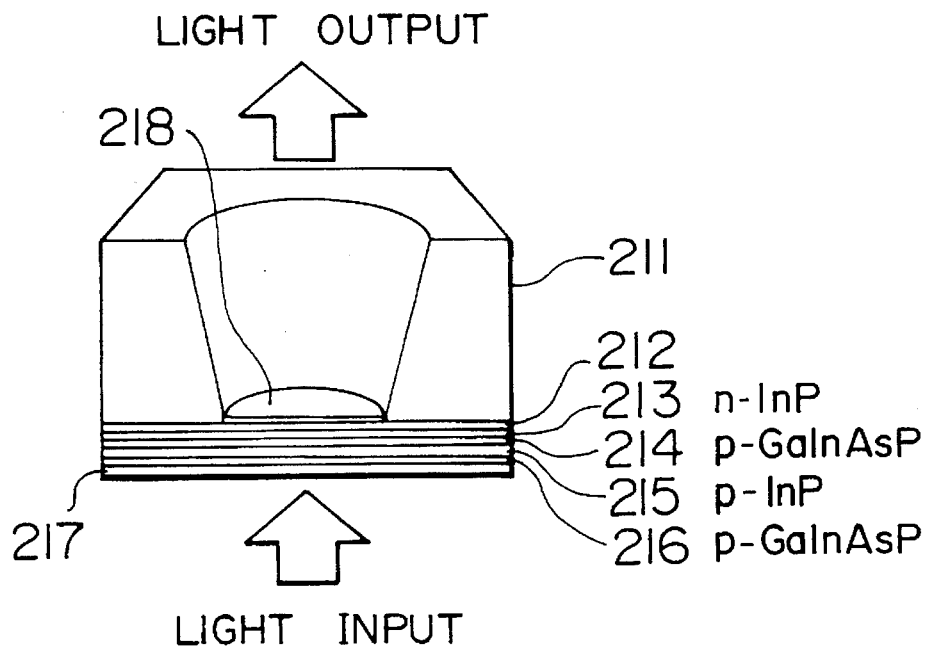
FIG. 2 is a cross-sectional view showing the structure of a prior art surface emission type tunable filter.
Figure 3:
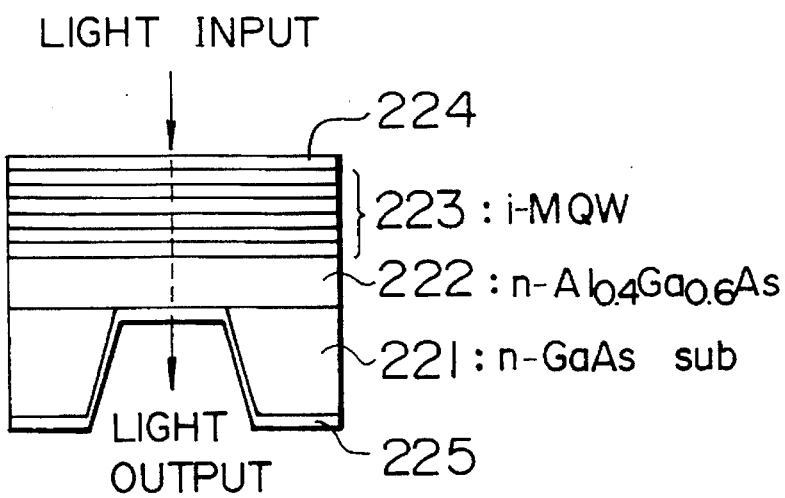
FIG. 3 is a cross-sectional view showing the structure of a prior art phase modulating device.
Figure 4A:
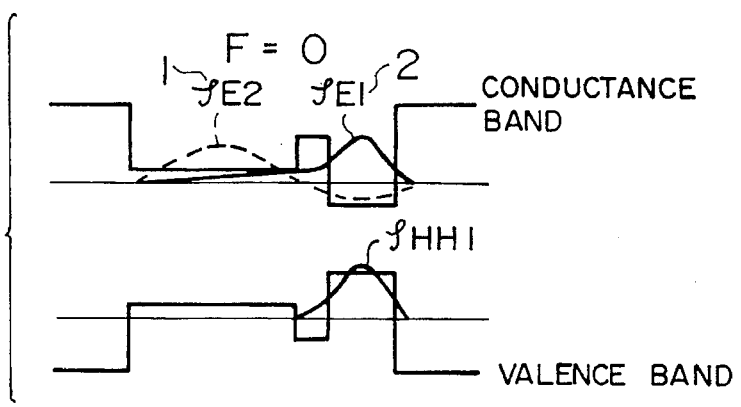
FIGS. 4A–4C are respectively views illustrating energy band structures and wave functions in respective electric field (F) -applied states (F=0, F=$F_1$ and F=$F_2$) for explaining the basic principle of the present invention.

First, the basic principle of the present invention will be explained by use of an example in which the ADQW consisting of two different quantum wells 1 and 2 (shallow well 1 of a wide width and deep well 2 of a narrow width) coupled to each other has an energy band structure as shown in FIG. 4A.

Figure 4B:
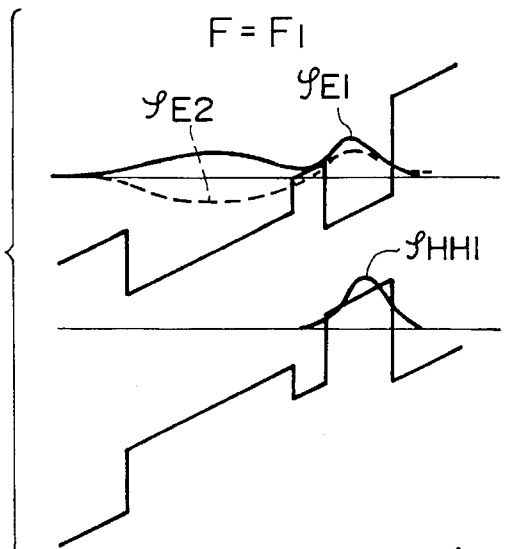
Figure 4C:
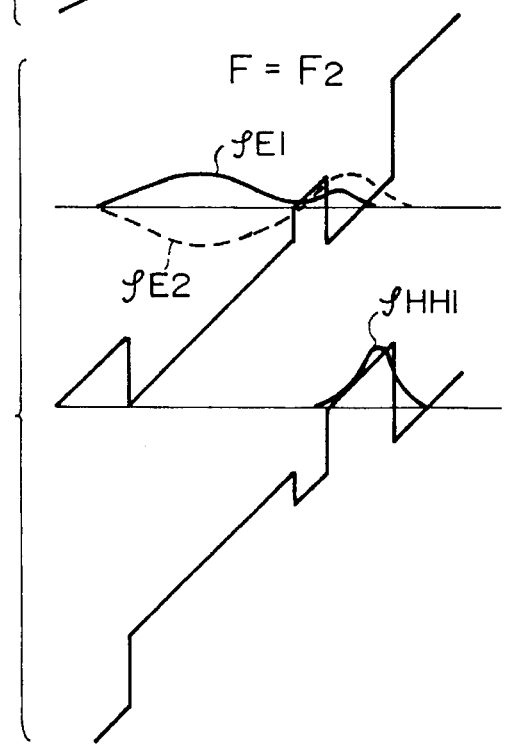

In FIGS. 4A–4C, wave functions $\psi_{E1}$ and $\psi_{E2}$ respectively having an electron ground level $E_1$ and an electron second level $E_2$ at the time of no electric field (F=0), electric field F=$F_1$ and electric field F=$F_2$ are respectively denoted by a solid line and dotted lines, and with respect of holes only a wave function $\psi_{HH1}$ of heavy holes having a ground level $HH_1$ is shown.

As the applied electric field increases, the wave functions $\psi_{E1}$ and $\psi_{E2}$ vary as shown in FIGS. 4B and 4C. The wave function $\psi_{E1}$ which is confined in the deep well 2 when no electric field is applied (FIG. 4A) begins to spread toward the wide, shallow well 1 as the applied electric field increases. In contrast, the wave function $\psi_{E2}$ comes to have a dense part in the narrow, deep well 2 as the applied electric field increases. The wave function $\psi_{HH1}$ of holes, however, scarcely varies even if the electric field increases.

The absorption factor $\alpha_{ex}$ of an exciton is proportional to an overlap integral between wave functions of electrons and holes as represented by:

$$\alpha_{ex} \propto \int \psi_E \times \psi_H dz \qquad (1)$$

Therefore, as is seen from FIGS. 4B and 4C, the absorption $\alpha_{ex}$ abruptly decreases as the electric field increases because the overlap between the wave functions $\psi_E$ and $\psi_H$ abruptly decreases as the electric field is increased.

In contrast, the energy or photon energy of exciton scarcely varies since the width of the deep well 2 is narrow and an energy gap between the levels $E_1$ and $HH_1$ scarcely varies. Namely, the intensity of an exciton peak due to transition between the lowest energy level $E_1$ and the energy level of heavy hole $HH_1$ abruptly decreases as the electric field decreases. And the amount of a red shift of exciton peak in which the energy or photon energy shifts to a lower value is small, as distinguished from normal QCSE.

In contrast, the overlap between the wave functions $\psi_{E2}$ and $\psi_{HH1}$ increases, and the intensity of an exciton peak resulting from the transition between the levels $E_2$ and $HH_1$ increases.

Figure 5A:
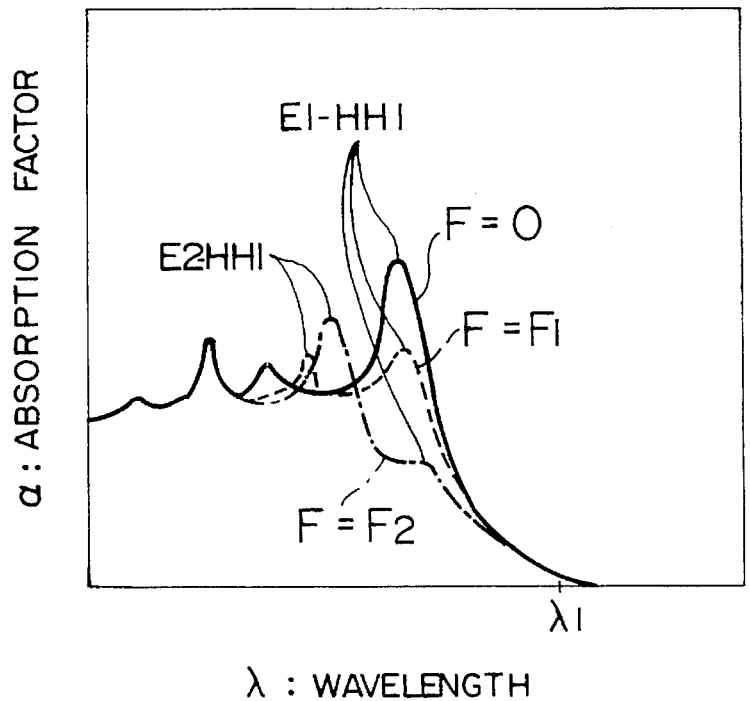
FIG. 5A is a representation illustrating the relationship between an absorption factor of a quantum well layer and an electric field applied thereto for explaining the basic principle of the present invention.

FIG. 5A illustrates the above-discussed situation. The wavelength or photon energy dependency of the absorption factor a varies in the following manner as the electric field is increased from zero to $F_1$ and $F_2$. When the elect, tic field is $F_1$, the exciton peak of transition between the levers $E_2$ and $HH_1$ begins to appear and the exciton peak of transition between the levels $E_1$ and $HH_1$ abruptly decreases as indicated by dotted lines. When the electric field is $F_2$, the exciton peak between the levels $E_1$ and $HH_1$ almost disappears as indicated by dash and dotted lines. Meanwhile, the energy (wavelength or photon energy) of the exciton peak between the levels $E_1$ and $HH_1$ remains almost unchanged as shown in FIG. 5A.

Figure 5B:
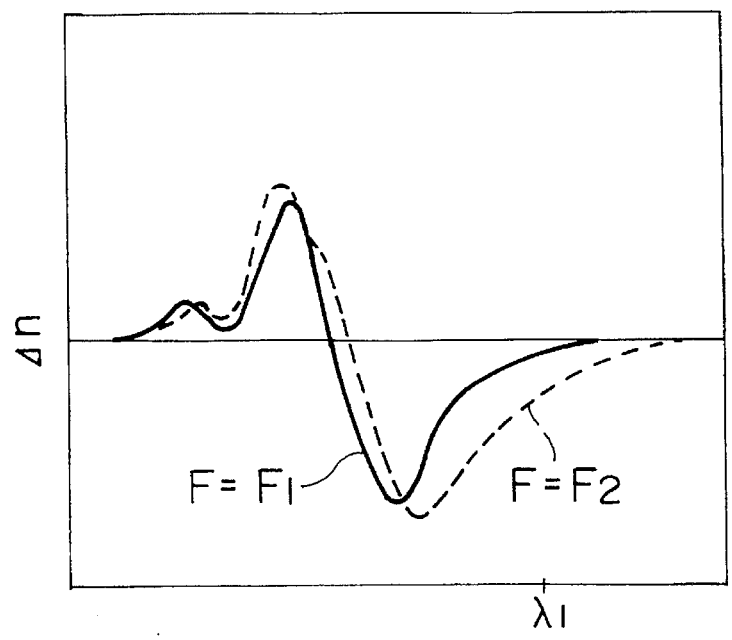
FIG. 5B is a representation illustrating the relationship between a refractive index variation Δn of the quantum well layer and the electric field for explaining the basic principle of the present invention.

On the other hand, the spectrum of the refractive index variance Δn at this time is shown in FIG. 5B. The wavelength or photon energy dependency of the index variance Δn at the time of electric field $F=F_1$ is indicated by a solid line, and that at the time of electric field $F=F_2$ $(>F_1)$ is indicated by dotted lines. For light of wavelength $\lambda_1$ whose photon energy is lower than that of the exciton peak between the levels $E_1$ and $HH_1$ at the time of electric field F=0, the absorption factor a remains almost unchanged since the red shift of the exciton peak between the levels $E_1$ and $HH_1$ scarcely occurs and only its intensity decreases as is explained referring to FIG. 5A. In contrast, the refractive index is considerably changed for the light of wavelength $\lambda_1$ as shown in FIG. 5B.

Figure 6A:
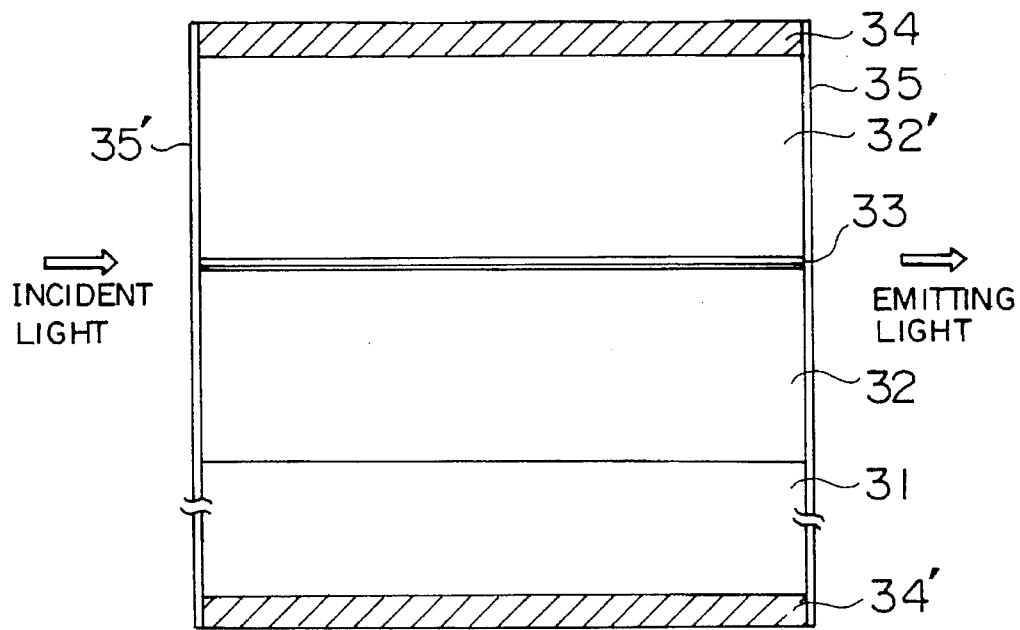
FIG. 6A is a cross-sectional view of a first embodiment of the present invention.
Figure 6B:
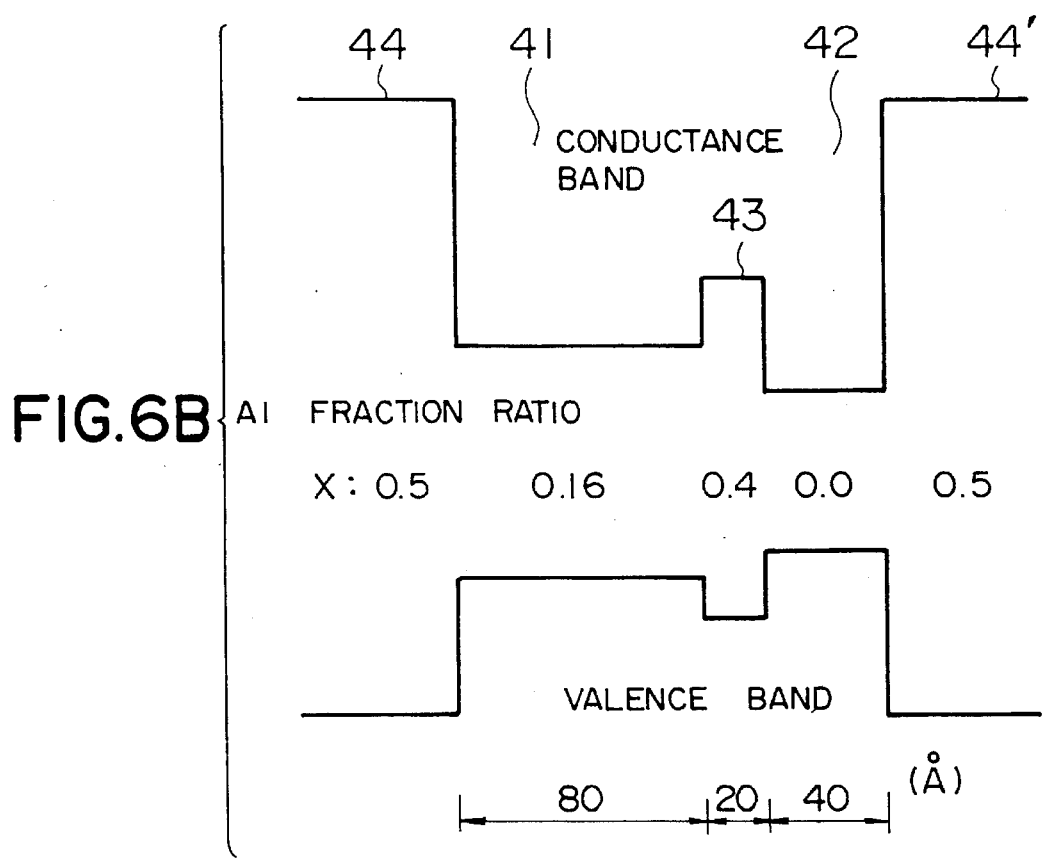
FIG. 6B is a representation illustrating the energy band struture of a quantum well layer of the first embodiment.

FIG. 6A shows a first embodiment of a phase modulator which uses the above-discussed principle and in which the amplitude of modulation is large and the variation of output intensity is small. FIG. 6B illustrates the energy band structure of its quantum well layer structure.

In FIG. 6A, on an n-GaAs substrate 31, there is provided an n-$Al_{0.5}Ga_{0.5}As$ clad layer 32 having a thickness of 1.5 μm, an ADQW layer 33, a p-$Al_{0.5}Ga_{0.5}As$ clad layer 32' having a thickness of 1.5 μm and an electrode 34 for applying an electric field to the ADQW layer 33. On the bottom surface of the substrate 31, another electrode 34' for applying the electric field to the ADQW layer 33 is formed. Anti-reflection coats 35 and 35' are respectively deposited on both end surfaces of the wafer for eliminating reflections at light input and output end surfaces.

The ADQW layer 33 is comprised of, from the side of the substrate 31, an i-$Al_{0.16}Ga_{0.84}As$ 41 well layer having a thickness of 80 Å, an i-GaAs well layer 42 having a thickness of 40 Å and an i-$Al_{0.4}Ga_{0.6}As$ barrier layer 43 having a thickness of 20 Å and formed therebetween as shown in FIG. 6B in the form of an energy band structure. Further, two i-$Al_{0.5}Ga_{0.5}As$ barrier layers 44 and 44' having a thickness of 100 Å are respectively formed outside of the well layers 41 and 42 to build the structure. In FIG. 6B, the right side corresponds to an upper side of the wafer of FIG. 6A.

In such structure, light from the outside couples to the ADQW layer 33 whose refractive index is larger than those of the n-type and p-type clad layers 32 and 32', and propagates therethrough.

Figure 7:
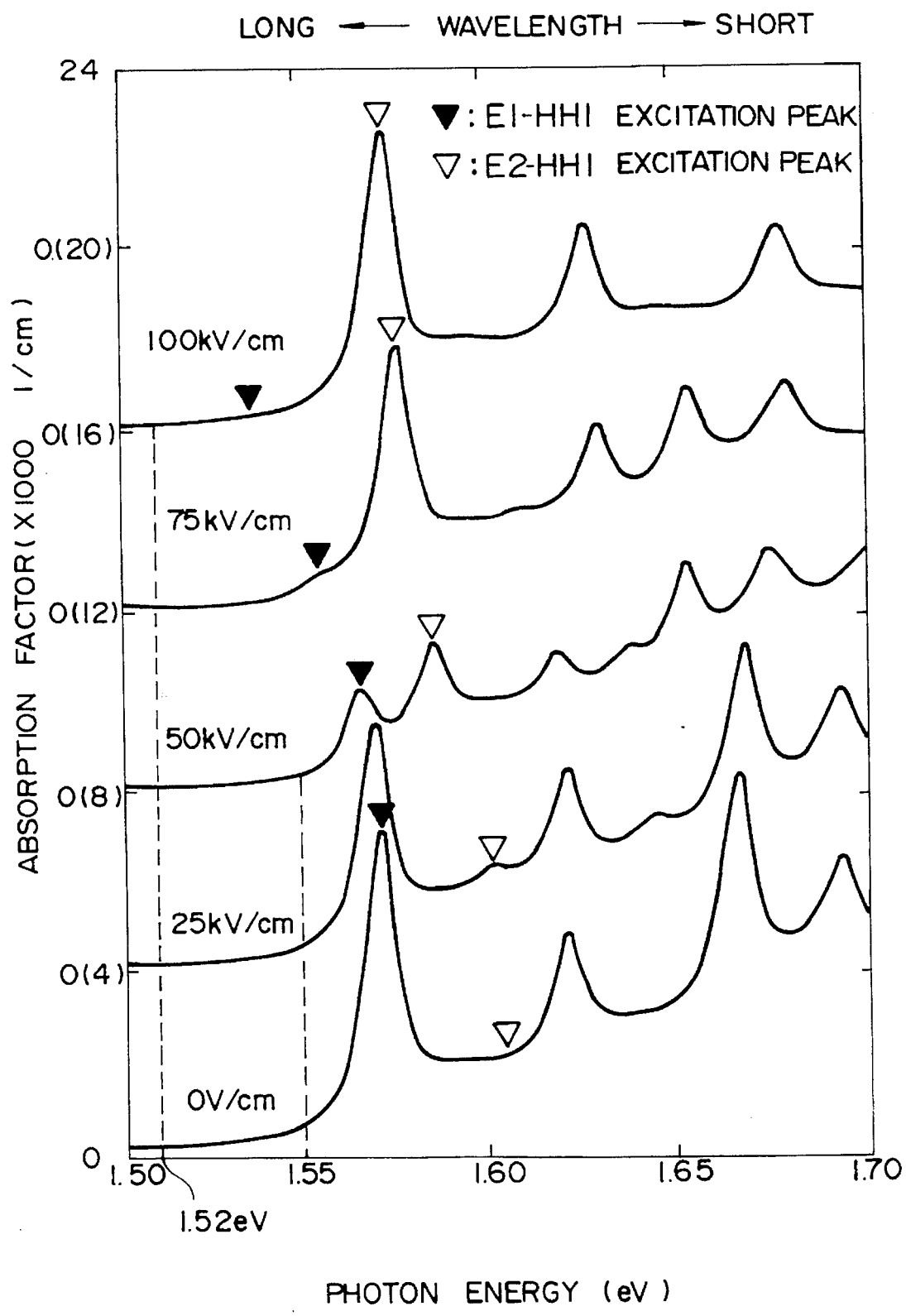
FIG. 7 is a representation illustrating the electric field dependency of an absorption factor of the first embodiment.
Figure 8A:
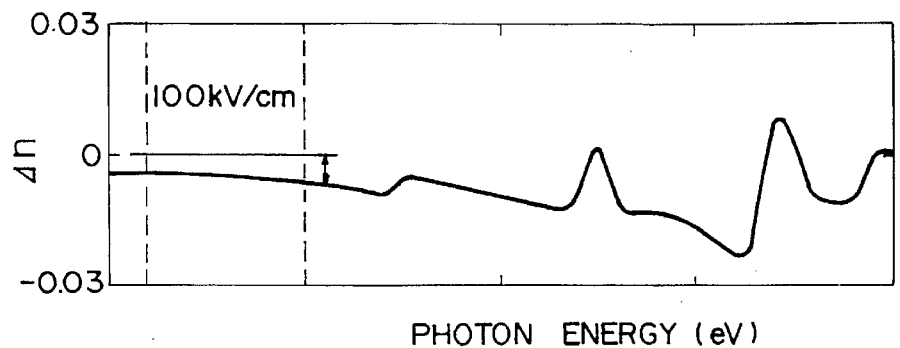
FIGS. 8A–8D are respectively representations illustrating the electric field dependency of a refractive index variance Δn of the first embodiment.
Figure 8B:
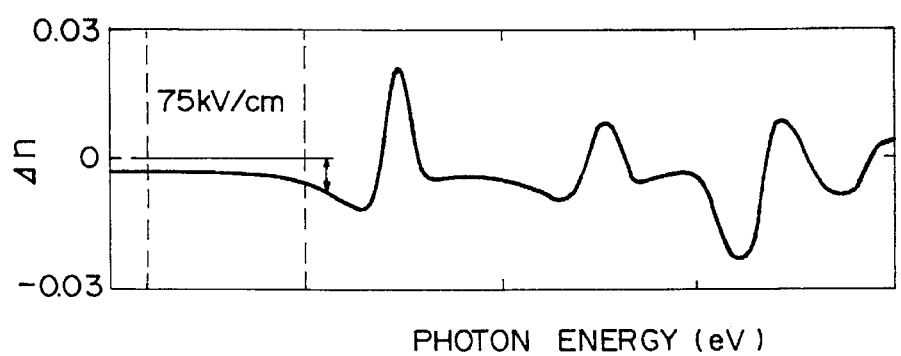
Figure 8C:
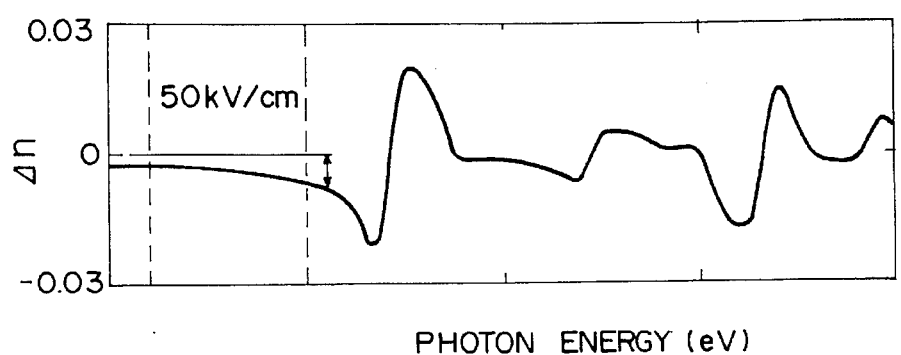
Figure 8D:
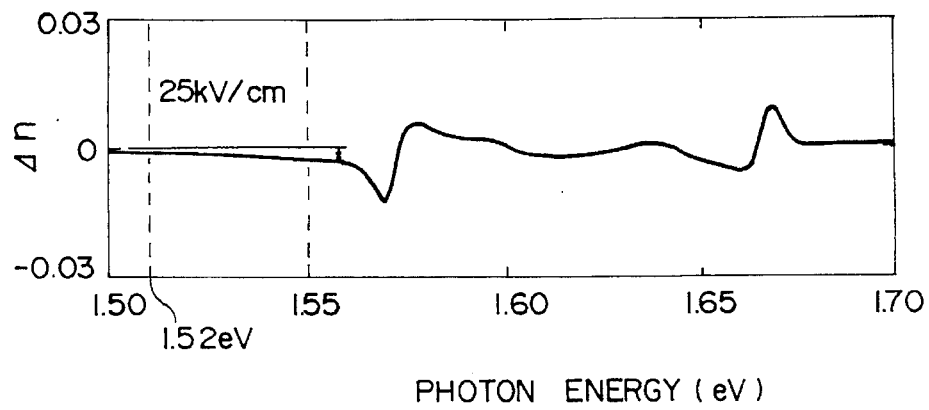

For respective applied electric fields, the wavelength dependencies of the absorption factor α of the quantum well layer 33 in the first embodiment are represented in FIG. 7. One scale on its ordinate indicates $\alpha=4\times1.000$ $cm^{-1}$, and respective indications on the ordinate also stand for origins for respective applied electric fields 0 V/cm, 25 kV/cm, 50 kV/cm, 75 kV/cm and 100 kV/cm. For all electric fields, the absorption factor α is in the vicinity of zero for photon energy of 1.50 eV.

As has been explained in the basic principle, the exciton peak (indicated by black triangles) of the transition between the revels $E_1$ and $HH_1$ disappears at the electric field 75 kV/cm, and instead the exciton peak (indicated by white triangles) of the transition between the levels $E_2$ and $HH_1$ appears. The photon energy of the exciton peak of the transition between the levels $E_1$ and $HH_1$ remains almost unchanged until the electric field of 50 kV/cm. As a result, the absorption factor α for photon energies below 1.55 eV remains almost unchanged irrespective of the change in electric field.

FIGS. 8A–8D illustrate the wavelength dependencies of the refractive index variation Δn due to the electric field for respective applied electric fields. It is seen therefrom that the refractive index variation Δn of about $5\times10^{-3}$ is obtained even for photon energies below 1.53 eV at which the absorption factor a is small.

In the first embodiment, the length of the waveguide shown in FIG. 6A is set to 200 μm. When light having a wavelength of 0.815 μ2 m (photon energy: 1.52 eV) was propagated through the waveguide, the application of an electric field of 50 eV/cm sufficed for modulating the phase of the propagated light by π and the variance of intensity of an output light fell within 1 dB.

Figure 9:
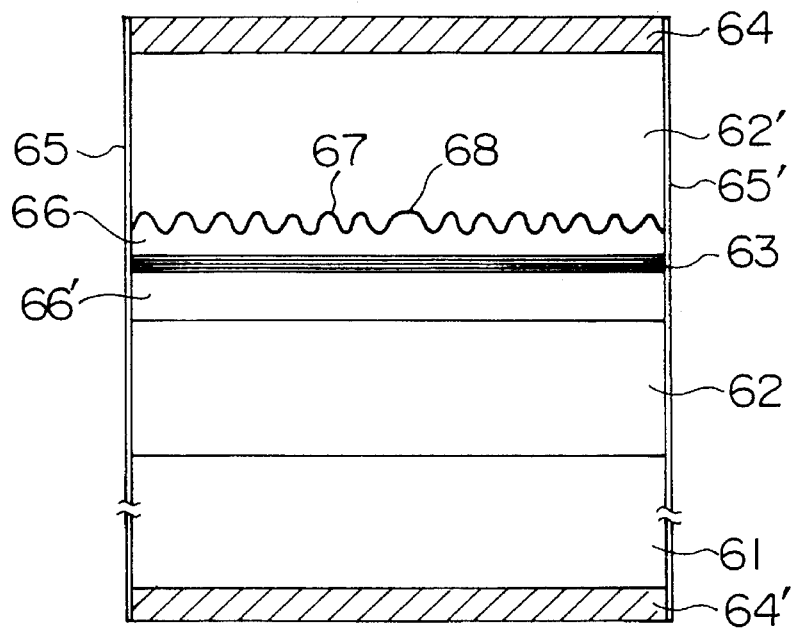
FIG. 9 is a cross-sectional view of a second embodiment of the present invention.

FIG. 9 shows a second embodiment of a tunable filter which uses the above-discussed principle. In FIG. 9, on an n-GaAs substrate 61, an n-$Al_{0.5}Ga_{0.5}As$ clad layer 62 having a thickness of 1.5 μm, an ADQW layer 53, a p-$Al_{0.5}Ga_{0.5}As$ clad layer 62' having a thickness of 1.5 μm and an electrode 64 for applying an electric field to the ADQW layer 63. On the bottom surface of the substrate 61, another electrode 64' for applying the electric field to the ADQW layer 63 is formed. Anti-reflection coats 65 and 65' are respectively deposited on both ends of the wafer for eliminating reflections at light input and output end surfaces. These layers and coats 61–65 and 65' are the same as those 31–35 and 35' of the first embodiment shown in FIG. 6A in material and structure. In the second embodiment, there are further provided i-$Al_{0.4}Ga_{0.6}As$ light guide layers 66 and 66' sandwiching the ADQW layer 63. A grating 67 is formed on the light guide layer 66', and a portion 68 for shifting its phase by λ/2 is formed on the grating 67 for stabilizing a wavelength to be selected or filtered.

Figure 10:
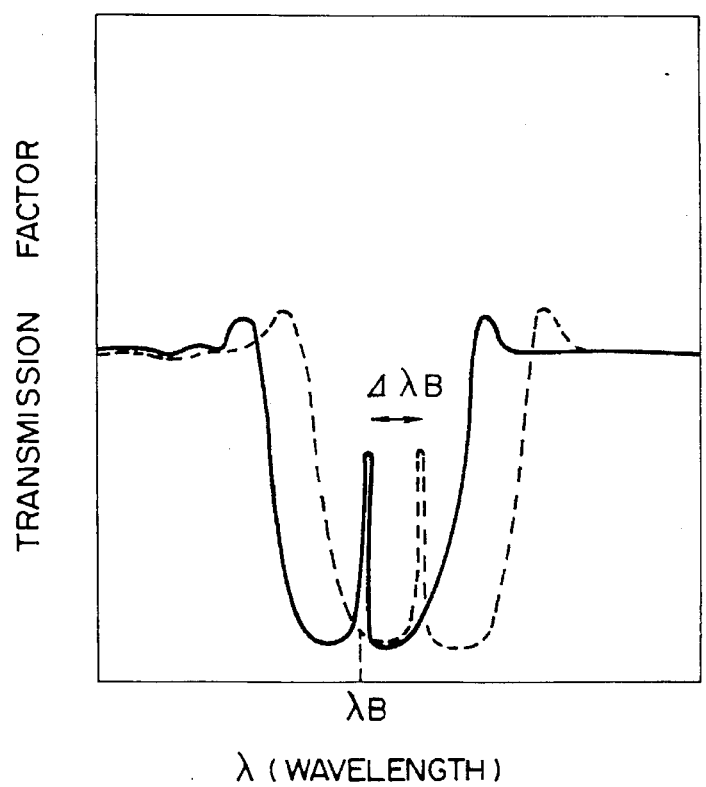
FIG. 10 is a representation illustrating a transmission factor spectrum of the second embodiment.

When light is propagated through the device of the second embodiment, the light is diffracted by the grating 67 and a transmission spectrum as illustrated in FIG. 10 is obtained. Where a pitch of the grating 67 is Λ, a Bragg diffraction wavelength $\lambda_B$ is represented by $\lambda_B=2n_{eff}$ Λ ($n_{eff}$ is an equivalent refractive index of the waveguide).

Here, when a reverse bias voltage is applied between the electrodes 64 and 64', only a refractive index of the waveguide is changed due to the above-discussed effect and the Bragg diffraction wavelength $\lambda_B$ is shifted by $\Delta\lambda_B=2\Delta n_{eff}\Lambda$.

Also in the second embodiment, the application of an electric field of 50 eV/cm sufficed for shifting the Bragg diffraction wavelength $\lambda_B$ by 12 Å and the variance of an intensity of an output light fell within 1 dB. Thus, a tunable filter which is capable of obtaining a filtering wavelength shift of 12 Å with a stable output is achieved.

In the second embodiment, light having wavelengths remote from the Bragg wavelength $\lambda_B$ a will be transmitted through the device as is seen from FIG. 10, so that the second embodiment could not be used as a filter when light having wavelength too remote from the Bragg wavelength $\lambda_B$ is incident on the device.

Figure 11:
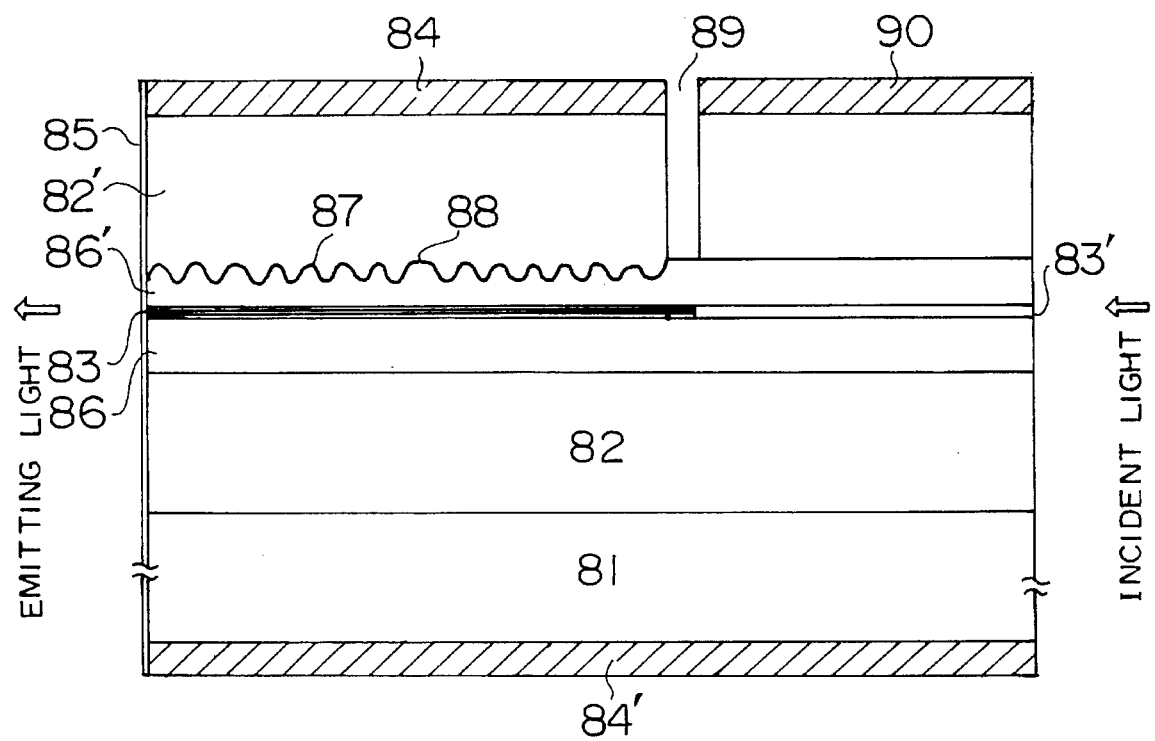
FIG. 11 is a cross-sectional view of a third embodiment of the present invention.

FIG. 11 shows a third embodiment which can solve the drawback of the second embodiment. The third embodiment uses the filter of the second embodiment as a reflector part and further includes an amplifying part with an active layer 83'. Thus, a filter with an amplification function is obtained and the third embodiment is capable of amplifying light of the Bragg wavelength $\lambda_B$ and emitting the same.

In FIG. 11, reference numerals 81–88 denote the same layers and portions 61–68 of the second embodiment of FIG. 9. There are further provided the i-$Al_{0.1}Ga_{0.9}As$ active layer 83' having a thickness of 0.1 μm, an electrode 90 for injecting current therethrough and a groove 89 for dividing electrodes 84 and 90 from each other.

Figure 12:
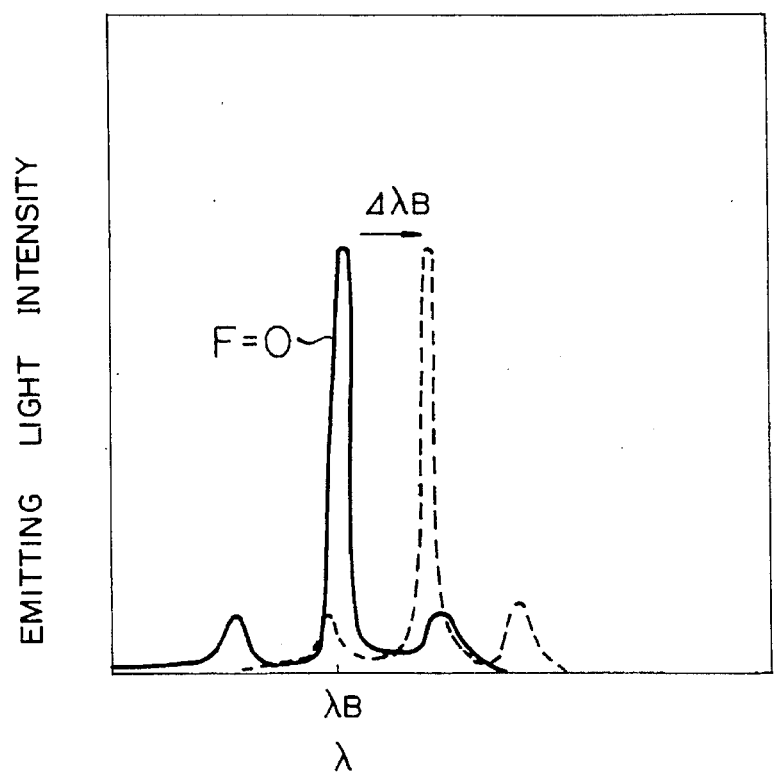
FIG. 12 is a representation illustrating the wavelength dependency of an intensity of emitting light of the third embodiment.

In the state in which current below a threshold for oscillation is caused to flow through the electrode 90, light is introduced into the active layer 83'. Then, only light of wavelength very near the Bragg wavelength $\lambda_B$ enters the filter, so that the drawback of the second embodiment is solved. The wavelength dependency of an intensity of emitting light is as shown in FIG. 12. Only light of wavelength of $\lambda_B$ is amplified to be output, when no bias votage is applied to the electrode 84 (F=0).

Similar to the second embodiment, the application of an electric field of 50 eV/cm sufficed for shifting the Bragg diffraction wavelength $\lambda_B$ by 12 Å($\Delta\lambda_B$=12 Å). Since the variance of an absorption factor due to the application of the electric field to a distributed reflector of the grating 87 is small as stated above, there is no need to control the current for amplification in the an amplifying part provided with the active layer 83', for shifting the wavelength of emitting light as shown in FIG. 12. A tunable filter having a good performance is thus achieved.

As discussed above, according to the present invention, a phase modulating device with improved modulation and a stable output is attained since there is provided a semiconductor quantum well layer in which the shift of an exciton peak wavelength due to QCSE by the application of a reverse bias electric field almost disappears and only a refractive index is changed in a given range of wavelength by tile application of the electric field while an absorption factor is very small and remains unchanged in such wavelength range.

Further, a tunable filter with a wide width of tunable wavelength and a stable output is attained. Consequently, an electric field modulation type optical device with little output variation is achieved since the variation of absorption factor due to the application of electric field is small.

Figure 13:
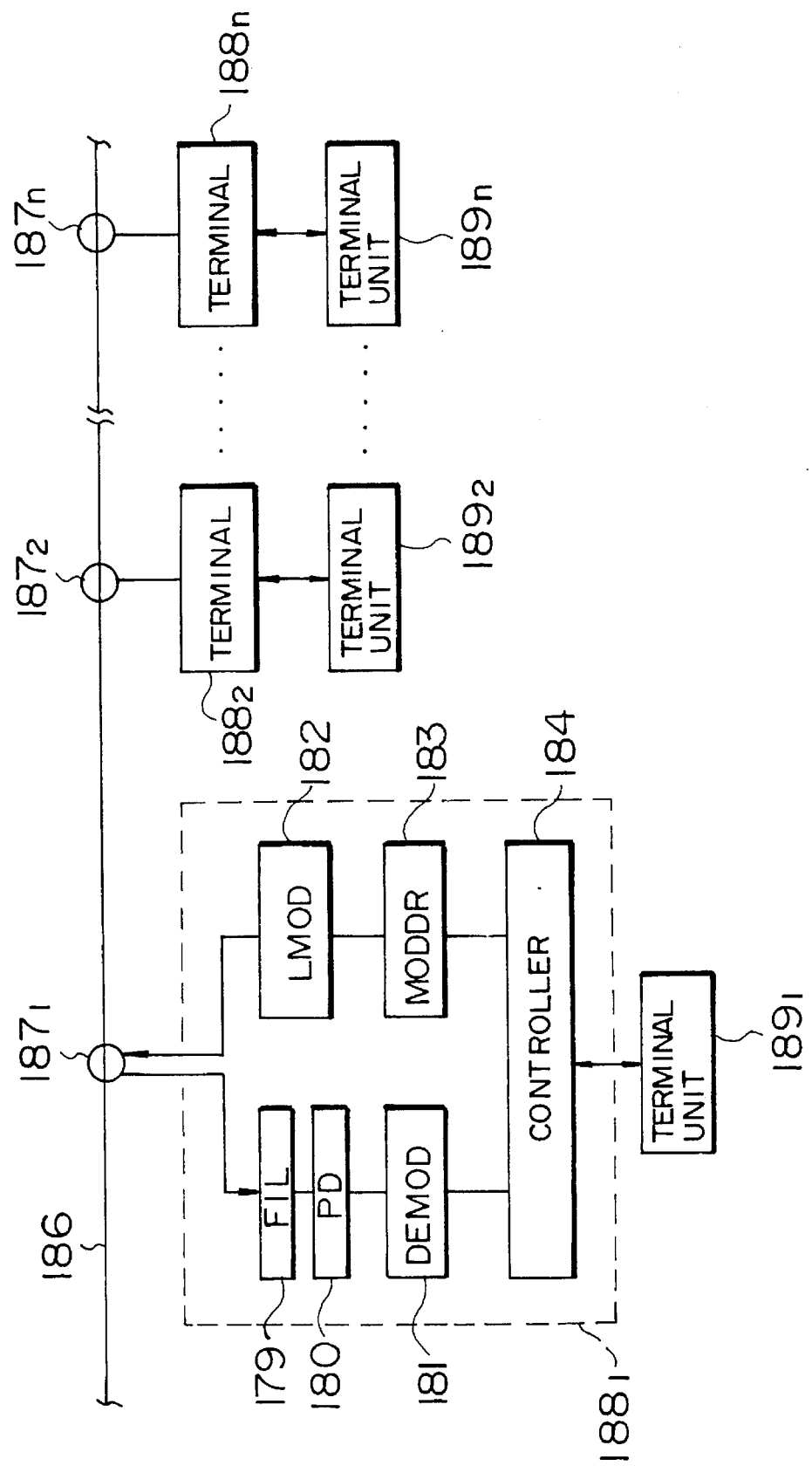
FIG. 13 is a block diagram showing an example of optical communication systems in which the optical device of the present invention is used as a filter and a light modulating device.

FIG. 13 shows a block diagram illustrating an optical communication system in which the devices of the present invention can be used as a light modulator or a filter. In FIG. 13, reference numeral 186 is an optical fiber for transmitting light signals. A plurality of terminals 188$_1$, 188$_2$, ..., 188$_n$ are connected to the optical fiber 186 through optical nodes 187$_1$, 187$_2$, ..., 187$_n$, respectively. Terminal units 189$_1$, 189$_2$, ..., 189$_n$ are connected to the respective terminals. Each terminal unit includes a keyboard, a display device, etc.

In each terminal, there are provided a light signal transmitter consisting of a light modulator 182 and a modulator driver 183 and a light signal receiver consisting of a filter 179, a photodetector 180 and a demodulator 181. The transmitter and receiver are controlled by a controller 184 according to instructions from the terminal unit 189$_1$. The light modulator 182 modulates a constant light from a laser diode (not shown) according to a signal from the driver 183 Namely, an external modulation is conducted instead of a direct modulation. The filter 179 selects a signal of desired wavelength from plural signals of different wavelengths and outputs this desired signal to the photodetector 180 (in this case, the wavelength division multiplexing is conducted).

While there has been shown and described what are considered preferred embodiments of the present invention, it will be obvious to those skilled in the art that various changes and modifications may be made therein without departing from the invention as defined by the following claims.

What is claimed is:

1. An optical device comprising:

a first quantum well layer;

a second quantum well layer having a smaller band gap and a smaller width than the band gap and width of said first quantum well layer;

a first barrier layer disposed between said first and second quantum well layers and having a greater band gap than the band gap of said first and second quantum well layers, electron waves in said first and second quantum well layers interfering with each other across said first barrier layer;

second and third barrier layers including therebetween said first barrier layer and said first and second quantum well layers, said second and third barrier layers having band gaps greater than the band gap of said first barrier layer; and application means for applying an electric field to said first and second quantum well layers to change refractive indices of said first and second quantum well layers for light of predetermined wavelengths while suppressing change of absorption factors of said first and second quantum well layers for the light of predetermined wavelengths, wherein a shift of an exciton peak wavelength due to quantum confined Stark effect by application of an electric field is small within a predetermined range of wavelengths.

2. An optical device according to claim 1, further comprising a p-type semiconductor layer and an n-type semiconductor layer for sandwiching said quantum well layers.

3. An optical device according to claim 2, wherein refractive indices of said p-type and n-type semiconductor layers are made smaller than those of said first and second quantum well layers.

4. A terminal for use in an optical communication system, comprising:

an optical receiver; and an optical transmitter having an optical modulator;

said optical modulator comprising:

a first quantum well layer;

a second quantum well layer having a smaller band gap and a smaller width than the band gap and width of said first quantum well layer;

a first barrier layer disposed between said first and second quantum well layers and having a greater band gap than the band gaps of said first and second quantum well layers, electron waves in said first and second quantum well layers interfering with each other across said first barrier layer;

second and third barrier layers including therebetween said first barrier layer and said first and second quantum well layers, said second and third barrier layers having band gaps greater than the band gap of said first barrier layer; and application means for applying an electric field to said first and second quantum well layers to change refractive indices of said first and second quantum well layers for light of predetermined wavelengths while suppressing change of absorption factors of said first and second quantum well layers for the light of predetermined wavelengths, thereby modulating the light of predetermined wavelengths for emission by said first and second quantum well layers, wherein a shift of an exciton peak wavelength due to quantum confined Stark effect by application of an electric field is small within a predetermined range of wavelengths.

5. A terminal for use in an optical communication system, comprising:

an optical transmitter; and an optical receiver having an optical filter;
said optical filter comprising:
  a first quantum well layer;
  a second quantum well layer having a smaller band gap and a smaller width than the band gap and width of said first quantum well layer;
  a first barrier layer disposed between said first and second quantum well layers and having a greater band gap than the band gaps of said first and second quantum well layers, electron waves in said first and second quantum well layers interfering with each other across said first barrier layer;
  second and third barrier layers including therebetween said first barrier layer and said first and second quantum well layers, said second and third barrier layers having band gaps greater than the band gap of said first barrier layer; and
  application means for applying an electric field to said first and second quantum well layers to change refractive indices of said first and second quantum well layers for light of predetermined wavelengths while suppressing change of absorption factors of said first and second quantum well layers for the light of predetermined wavelengths, thereby filtering the light of predetermined wavelengths,
wherein a shift of an exciton peak wavelength due to quantum confined Stark effect by application of an electric field is small within a predetermined range of wavelengths.

6. An optical communication system, comprising:
a plurality of terminals each including an optical transmitter and an optical receiver; and
a plurality of terminals each including an optical transmitter and an optical receiver; and
optical paths which interconnect said terminals;
wherein said optical transmitter has an optical modulator which comprises:
  a first quantum well layer;
  a second quantum well layer having a smaller band gap and a smaller width than the band gap and width of said first quantum well layer;
  a first barrier layer disposed between said first and second quantum well layers and having a greater band gap than the band gaps of said first and second quantum well layers, electron waves in said first and second quantum well layers interfering with each other across said first barrier layer;
  second and third barrier layers including therebetween said first barrier layer and said first and second quantum well layers, said second and third barrier layers having band gaps greater than the band gap of said first barrier layer; and
  application means for applying an electric field to said first and second quantum well layers to change refractive indices of said first and second quantum well layers for light of predetermined wavelengths while suppressing change of absorption factors of said first and second quantum well layers for the light of predetermined wavelengths, thereby modulating the light of predetermined wavelengths for emission by said first and second quantum well layers,
wherein a shift of an exciton peak wavelength due to quantum confined Stark effect by application of an electric field is small within a predetermined range of wavelengths.

7. An optical communication system comprising:
a plurality of terminals each including an optical transmitter and an optical receiver; and
optical paths which interconnect said terminals;
wherein said optical receiver has an optical filter which comprises:
  a first quantum well layer;
  a second quantum well layer having a smaller band gap and a smaller width than the band gap and width of said first quantum well layer;
  a first barrier layer disposed between said first and second quantum well layers and having a greater band gap than the band gaps of said first and second quantum well layers, electron waves in said first and second quantum well layers interfering with each other across said first barrier layer;
  second and third barrier layers including therebetween said first barrier layer and said first and second quantum well layers, said second and third barrier layers having band gaps greater than the band gap of said first barrier layer; and
  application means for applying an electric field to said first and second quantum well layers to change refractive indices of said first and second quantum well layers for light of predetermined wavelengths while suppressing change of absorption factors of said first and second quantum well layers for the light of predetermined wavelengths, thereby filtering the light of predetermined wavelengths,
wherein a shift of an exciton peak wavelength due to quantum confined Stark effect by application of an electric field is small within a predetermined range of wavelengths.

8. An optical device comprising:
a first quantum well layer;
a second quantum well layer having a smaller band gap and a smaller width than the band gap and width of said first quantum well layer;
a first barrier layer disposed between said first and second quantum well layers and having a greater band gap than the band gaps of said first and second quantum well layers, electron waves in said first and second quantum well layers interfering with each other across said first barrier layer;
second and third barrier layers including therebetween said first barrier layer and said first and second quantum well layers, said second and third barrier layers having band gaps greater than the band gap of said first barrier layer;
first application means for applying an electric field to said first and second quantum well layers to change refractive indices of said first and second quantum well layers for light of predetermined wavelengths while suppressing change of absorption factors of said first and second quantum well layers for the light of predetermined wavelengths; and
a grating formed near said first and second quantum well layers,
wherein a shift of an exciton peak wavelength due to quantum confined Stark effect by application of an electric field is small within a predetermined range of wavelengths.

9. An optical device according to claim 8, further comprising an semiconductor active area for amplifying an incident light, said active area including an active layer, and second applying means for applying an electric field to said active layer separately from said first applying means.

10. An optical device according to claim 8, further comprising a p-type semiconductor layer and an n-type semiconductor layer for sandwiching said and second quantum well layers.

11. An optical device according to claim 10, wherein refractive indices of said p-type and n-type semiconductor layers are made smaller than the refractive indices of said first and second quantum well layers.

12. A terminal for use in an optical communication system, comprising:

an optical receiver; and an optical transmitter having an optical modulator;

said optical modulator comprising:
 a first quantum well layer;
 a second quantum well layer having a smaller band gap and a smaller width than the band gap and width of said first quantum well layer;
 a first barrier layer disposed between said first and second quantum well layers and having a greater band gap than the band gaps of said first and second quantum well layers, electron waves in said first and second quantum well layers interfering with each other across said first barrier layer;
 second and third barrier layers including therebetween said first barrier layer and said first and second quantum well layers, said second and third barrier layers having band gaps greater than the band gap of said first barrier layer;
 application means for applying an electric field to said first and second quantum well layers to change refractive indices of said first and second quantum well layers for light of predetermined wavelengths while suppressing change of absorption factors of said first and second quantum well layers for the light of predetermined wavelengths, thereby modulating the light of predetermined wavelengths for emission by said first and second quantum well layers; and
 a grating formed near said first and second quantum well layers, wherein a shift of an exciton peak wavelength due to quantum confined Stark effect by application of an electric field is small within a predetermined range of wavelengths.

13. A terminal for use in an optical communication system, comprising:

an optical transmitter; and an optical receiver having an optical filter;

said optical filter comprising:
 a first quantum well layer;
 a second quantum well layer having a smaller band gap and a smaller width than the band gap and width of said first quantum well layer;
 a first barrier layer disposed between said first and second quantum well layers and having a greater band gap than the band gaps of said first and second quantum well layers, electron waves in said first and second quantum well layers interfering with each other across said first barrier layer;
 second and third barrier layers including therebetween said first barrier layer and said first and second quantum well layers, said second and third barrier layers having band gaps greater than the band gap of said first barrier layer;
 application means for applying an electric field to said first and second quantum well layers to change refractive indices of said first and second quantum well layers for light of predetermined wavelengths while suppressing change of absorption factors of said first and second quantum well layers for the light of predetermined wavelengths, thereby filtering the light of predetermined wavelengths; and
 a grating formed near said first and second quantum well layers, wherein a shift of an exciton peak wavelength due to quantum confined Stark effect by application of an electric field is small within a predetermined range of wavelengths.

14. An optical communication system comprising:

a plurality of terminals each including an optical transmitter and an optical receiver; and optical paths which interconnect said terminals;

wherein said optical transmitter has an optical modulator which comprises:
 a first quantum well layer;
 a second quantum well layer having a smaller band gap and a smaller width than the band gap and width of said first quantum well layer;
 a first barrier layer disposed between said first and second quantum well layers and having a greater band gap than the band gaps of said first and second quantum well layers, electron waves in said first and second quantum well layers interfering with each other across said first barrier layer;
 second and third barrier layers including therebetween said first barrier layer and said first and second quantum well layers, said second and third barrier layers having band gaps greater than the band gap of said first barrier layer;
 application means for applying an electric field to said first and second quantum well layers to change refractive indices of said first and second quantum well layers for light of predetermined wavelengths while suppressing change of absorption factors of said first and second quantum well layers for the light of predetermined wavelengths, thereby modulating the light of predetermined wavelengths for emission by said first and second quantum well layers; and
 a grating formed near said first and second quantum well layers, wherein a shift of an exciton peak wavelength due to quantum confined Stark effect by application of an electric field is small within a predetermined range of wavelengths.

15. An optical communication system comprising:

a plurality of terminals each including an optical transmitter and an optical receiver; and optical paths which interconnect said terminals;

wherein said optical receiver has an optical filter which comprises:
 a first quantum well layer;
 a second quantum well layer having a smaller band gap and a smaller width than the band gap and width of said first quantum well layer;
 a first barrier layer disposed between said first and second quantum well layers and having a greater band gap than the band gaps of said first and second quantum well layers, electron waves in said first and second quantum well layers interfering with each other across said first barrier layer;

second and third barrier layers including therebetween said first barrier layer and said first and second quantum well layers, said second and third barrier layers having band gaps greater than the band gap of said first barrier layer;

application means for applying an electric field to said first and second quantum well layers to change refractive indices of said first and second quantum well layers for light of predetermined wavelengths while suppressing change of absorption factors of said first and second quantum well layers for the light of predetermined wavelengths, thereby filtering the light of predetermined wavelengths; and a grating formed near said first and second quantum well layers, wherein a shift of an exciton peak wavelength due to quantum confined Stark effect by application of an electric field is small within a predetermined range of wavelengths.

16. A method for modulating a light of predetermined wavelength in an optical modulator comprising a first quantum well layer, a second quantum well layer having a smaller band gap and a smaller width than the band gap and width of said first quantum well layer, a first barrier layer disposed between said first and second quantum well layers and having a greater band gap than the band gaps of said first and second quantum well layers, electron waves in said first and second quantum well layers interfering with each other across said first barrier layer, second and third barrier layers including therebetween said first barrier layer and said first and second quantum well layers, said second and third barrier layers having band gaps greater than the band gap of said first barrier layer and application means for applying an electric field to said first and second quantum well layers; said method comprising the steps of:

coupling the light of predetermined wavelength to said first and second quantum well layers;

changing refractive indices of said first and second quantum well layers for the light of predetermined wavelength while suppressing change of absorption factors of said first and second quantum well layers for the light of predetermined wavelength by applying the electric field to said first and second quantum well layers, thereby modulating the light of predetermined wavelength; and emitting the modulated light from said first and second quantum well layers, wherein a shift of an exciton peak wavelength due to quantum confined Stark effect by application of an electric field is small within a predetermined range of wavelengths.

17. An optical receiver comprising:

an optical filter comprising:

a first quantum well layer;

a second quantum well layer having a smaller band gap and a smaller width than the band gap and width of said first quantum well layer;

a first barrier layer disposed between said first and second quantum well layers and having a greater band gap than the band gaps of said first and second quantum well layers, electron waves in said first and second quantum well layers interfering with each other across said first barrier layer;

second and third barrier layers including therebetween said first barrier layer and said first and second quantum well layers, said second and third barrier layers having band gaps greater than the band gap of said first barrier layer;

first application means for applying an electric field to said first and second quantum well layers to change refractive indices of said first and second quantum well layers for light of predetermined wavelengths while suppressing change of absorption factors of said first and second quantum well layers for the light of predetermined wavelengths, thereby filtering the light of predetermined wavelengths; and a grating formed near said first and second quantum well layers, wherein a shift of an exciton peak wavelength due to quantum confined Stark effect by application of an electric field is small within a predetermined range of wavelengths.

18. A method for filtering a light of predetermined wavelength in an optical filter comprising a first quantum well layer, a second quantum well layer having a smaller band gap and a smaller width than the band gap and width of said first quantum well layer, a first barrier layer disposed between said first and second quantum well layers and having a greater band gap than the band gaps of said first and second quantum well layers, electron waves in said first and second quantum well layers interfering with each other across said first barrier layer, second and third barrier layers including therebetween said first barrier layer and said first and second quantum well layers, said second and third barrier layers having band gaps greater than the band gap of said first barrier layer and application means for applying an electric field to said first and second quantum well layers; said method comprising the steps of:

coupling the light of predetermined wavelength to said first and second quantum well layers;

changing refractive indices of said first and second quantum well layers for the light of predetermined wavelength while suppressing change of absorption factors of said first and second quantum well layers for the light of predetermined wavelength by applying the electric field to said first and second quantum well layers, thereby filtering the light of predetermined wavelength; and emitting the filtered light from said first and second quantum well layers, wherein a shift of an exciton peak wavelength due to quantum confined Stark effect by application of an electric field is small within a predetermined range of wavelengths.

19. An optical device according to claim 1, further comprising light incident and light emitting end surfaces and anti-reflection coats formed on said light incident and light emitting end surfaces.

20. An optical modulator comprising:

a first quantum well layer;

a second quantum well layer having a smaller band gap and a smaller width than the band gap and width of said first quantum well layer;

a first barrier layer disposed between said first and second quantum well layers and having a greater band gap than the band gap of said first and second quantum well layers, electron waves in said first and second quantum well layers interfering with each other across said first barrier layer;

second and third barrier layers including therebetween said first barrier layer and said first and second quantum well layers, said second and third barrier layers having band gaps greater than the band gap of said first barrier layer; and application means for applying an electric field to said first and second quantum well layers to change refractive indices of said first and second quantum well layers for light of predetermined wavelengths while suppressing change of absorption factors of said first and second quantum well layers for the light of predetermined wavelengths, thereby modulating the light of predetermined wavelengths for emission by said first and second quantum well layers;

wherein a shift of an exciton peak wavelength due to quantum confined Stark effect by application of an electric field is small within a predetermined range of wavelengths.

21. An optical filter comprising:

a first quantum well layer;

a second quantum well layer having a smaller band gap and a smaller width than the band gap and width of said first quantum well layer;

a first barrier layer disposed between said first and second quantum well layers and having a greater band gap than the band gap of said first and second quantum well layers, electron waves in said first and second quantum well layers interfering with each other across said first barrier layer;

second and third barrier layers including therebetween said first barrier layer and said first and second quantum well layers, said second and third barrier layers having band gaps greater than the band gap of said first barrier layer; and application means for applying an electric field to said first and second quantum well layers to change refractive indices of said first and second quantum well layers for light of predetermined wavelengths while suppressing change of absorption factors of said first and second quantum well layers for the light of predetermined wavelengths, thereby filtering the light of predetermined wavelengths;

wherein a shift of an exciton peak wavelength due to quantum confined Stark effect by application of an electric field is small within a predetermined range of wavelengths.

22. An optical transmitter comprising:

an optical modulator comprising:
  a first quantum well layer;
  a second quantum well layer having a smaller band gap and a smaller width than the band gap and width of said first quantum well layer;
  a first barrier layer disposed between said first and second quantum well layers and having a greater band gap than the band gap of said first and second quantum well layers, electron waves in said first and second quantum well layers interfering with each other across said first barrier layer;
  second and third barrier layers including therebetween said first barrier layer and said first and second quantum well layers, said second and third barrier layers having band gaps greater than the band gap of said first barrier layer; and application means for applying an electric field to said first and second quantum well layers to change refractive indices of said first and second quantum well layers for light of predetermined wavelengths while suppressing change of absorption factors of said first and second quantum well layers for the light of predetermined wavelengths, thereby modulating the light of predetermined wavelengths for emission by said first and second quantum well layers, wherein a shift of an exciton peak wavelength due to quantum confined Stark effect by application of an electric field is small within a predetermined range of wavelengths.

23. An optical receiver comprising:

an optical filter comprising:
  a first quantum well layer;
  a second quantum well layer having a smaller band gap and a smaller width than the band gap and width of said first quantum well layer;
  a first barrier layer disposed between said first and second quantum well layers and having a greater band gap than the band gap of said first and second quantum well layers, electron waves in said first and second quantum well layers interfering with each other across said first barrier layer;
  second and third barrier layers including therebetween said first barrier layer and said first and second quantum well layers, said second and third barrier layers having band gaps greater than the band gap of said first barrier layer; and
  application means for applying an electric field to said first and second quantum well layers to change refractive indices of said first and second quantum well layers for light of predetermined wavelengths while suppressing change of absorption factors of said first and second quantum well layers for the light of predetermined wavelengths, thereby filtering the light of predetermined wavelengths,
  wherein a shift of an exciton peak wavelength due to quantum confined Stark effect by application of an electric field is small within a predetermined range of wavelengths.

24. An optical device according to claim 8, further comprising light incident and light emitting end surfaces and anti-reflection coats formed on said light incident and light emitting end surfaces.

25. An optical modulator comprising:

a first quantum well layer;

a second quantum well layer having a smaller band gap and a smaller width than the band gap and width of said first quantum well layer;

a first barrier layer disposed between said first and second quantum well layers and having a greater band gap than the band gaps of said first and second quantum well layers, electron waves in said first and second quantum well layers interfering with each other across said first barrier layer;

second and third barrier layers including therebetween said first barrier layer and said first and second quantum well layers, said second and third barrier layers having band gaps greater than the band gap of said first barrier layer;

first application means for applying an electric field to said first and second quantum well layers to change refractive indices of said first and second quantum well layers for light of predetermined wavelengths while suppressing change of absorption factors of said first and second quantum well layers for the light of predetermined wavelengths, thereby modulating the light of predetermined wavelengths for emission by said first and second quantum well layers; and a grating formed near said first and second quantum well layers, wherein a shift of an exciton peak wavelength due to quantum confined Stark effect by application of an electric field is small within a predetermined range of wavelengths.

26. An optical filter comprising:

a first quantum well layer;

a second quantum well layer having a smaller band gap and a smaller width than the band gap and width of said first quantum well layer;

a first barrier layer disposed between said first and second quantum well layers and having a greater band gap than the band gaps of said first and second quantum well layers, electron waves in said first and second quantum well layers interfering with each other across said first barrier layer;

second and third barrier layers including therebetween said first barrier layer and said first and second quantum well layers, said second and third barrier layers having band gaps greater than the band gap of said first barrier layer;

first application means for applying an electric field to said first and second quantum well layers to change refractive indices of said first and second quantum well layers for light of predetermined wavelengths while suppressing change of absorption factors of said first and second quantum well layers for the light of predetermined wavelengths, thereby filtering the light of predetermined wavelengths; and a grating formed near said first and second quantum well layers, wherein a shift of an exciton peak wavelength due to quantum confined Stark effect by application of an electric field is small within a predetermined range of wavelengths.

27. An optical transmitter comprising:

an optical modulator comprising:

a first quantum well layer;

a second quantum well layer having a smaller band gap and a smaller width than the band gap and width of said first quantum well layer;

a first barrier layer disposed between said first and second quantum well layers and having a greater band gap than the band gaps of said first and second quantum well layers, electron waves in said first and second quantum well layers interfering with each other across said first barrier layer;

second and third barrier layers including therebetween said first barrier layer and said first and second quantum well layers, said second and third barrier layers having band gaps greater than the band gap of said first barrier layer;

first application means for applying an electric field to said first and second quantum well layers to change refractive indices of said first and second quantum well layers for light of predetermined wavelengths while suppressing change of absorption factors of said first and second quantum well layers for the light of predetermined wavelengths, thereby modulating the light of predetermined wavelengths for emission by said first and second quantum well layers; and a grating formed near said first and second quantum well layers, wherein a shift of an exciton peak wavelength due to quantum confined Stark effect by application of an electric field is small within a predetermined range of wavelengths.

* * * * *

UNITED STATES PATENT AND TRADEMARK OFFICE
CERTIFICATE OF CORRECTION

PATENT NO. : 5,569,934                    Page 1 of 3
DATED : October 29, 1996
INVENTOR(S) : KAZUHITO FUJII, ET AL.

It is certified that error appears in the above-indentified patent and that said Letters Patent is hereby corrected as shown below:

On the title page: Item

[56] References Cited:

FOREIGN PATENT DOCUMENTS

"1204019   8/1989   Japan" should read
--1-204019  8/1989  Japan--.

"2210332   8/1990   Japan" should read
--2-210332  8/1990  Japan--.

"3179428   5/1991   Japan" should read
--3-179428  5/1991  Japan--.

[57] ABSTRACT:

Line 30, "deeper" should read --deep--.

COLUMN 1:

Line 16, "According" should read --According to--.
Line 31, "Light" should read --light--.

UNITED STATES PATENT AND TRADEMARK OFFICE
CERTIFICATE OF CORRECTION

PATENT NO. : 5,569,934
DATED : October 29, 1996
INVENTOR(S) : KAZUHITO FUJII, ET AL.

It is certified that error appears in the above-indentified patent and that said Letters Patent is hereby corrected as shown below:

COLUMN 3:

Line 7, "deeper" should read --deep--.

COLUMN 4:

Line 10, "wilt" should read --will--.
Line 58, "elect, ic" should read --electric--.

COLUMN 5:

Line 56, "revels" should read --levels--.

COLUMN 6:

Line 6, "$\mu$2 m" should read --$\mu$m--.
Line 12, "substrate 61," should read --substrate 61 is deposited,--.
Line 14, "layer 53." should read --layer 63,--.

UNITED STATES PATENT AND TRADEMARK OFFICE
CERTIFICATE OF CORRECTION

PATENT NO. : 5,569,934    Page 3 of 3
DATED : October 29, 1996
INVENTOR(S) : KAZUHITO FUJII, ET AL.

It is certified that error appears in the above-indentified patent and that said Letters Patent is hereby corrected as shown below:

<u>COLUMN 7</u>:

Line 6, "voltage" should read --voltage--.
    Line 24, "tile" should read --the--.

<u>COLUMN 10</u>:

Line 66, "an" (first occurrence) should read --a--.

Signed and Sealed this

Fourteenth Day of October, 1997

*Attest:*

BRUCE LEHMAN

*Attesting Officer*    *Commissioner of Patents and Trademarks*